United States Patent
Georgescu et al.

(10) Patent No.: US 12,300,342 B2
(45) Date of Patent: May 13, 2025

(54) SYSTEM AND METHOD FOR TESTING A NON-VOLATILE MEMORY

(71) Applicant: Infineon Technologies LLC, San Jose, CA (US)

(72) Inventors: Bogdan Georgescu, Colorado Springs, CO (US); Cristinel Zonte, Colorado Springs, CO (US); Vijay Raghavan, Driftwood, CO (US)

(73) Assignee: Infineon Technologies LLC, San Jose, CA (US)

( * ) Notice: Subject to any disclaimer, the term of this patent is extended or adjusted under 35 U.S.C. 154(b) by 252 days.

(21) Appl. No.: 18/069,408

(22) Filed: Dec. 21, 2022

(65) Prior Publication Data
US 2024/0212781 A1 Jun. 27, 2024

(51) Int. Cl.
*G11C 29/46* (2006.01)
*G11C 7/06* (2006.01)
*G11C 29/12* (2006.01)

(52) U.S. Cl.
CPC .............. *G11C 29/46* (2013.01); *G11C 7/067* (2013.01); *G11C 29/1201* (2013.01)

(58) Field of Classification Search
CPC ...... G11C 29/46; G11C 29/1201; G11C 7/067
See application file for complete search history.

(56) References Cited

U.S. PATENT DOCUMENTS

| | | | |
|---|---|---|---|
| 5,596,527 A * | 1/1997 | Tomioka | G11C 11/5621 365/185.21 |
| 5,701,265 A | 12/1997 | Calligaro | |
| 6,201,742 B1 * | 3/2001 | Hirai | G11C 16/3431 365/189.09 |
| 6,975,543 B2 * | 12/2005 | Kurihara | G11C 16/28 365/222 |
| 7,630,263 B2 * | 12/2009 | Pio | G11C 29/50004 365/210.15 |
| 7,969,804 B1 * | 6/2011 | Hirose | G11C 5/145 365/207 |
| 8,351,268 B2 * | 1/2013 | Ogawa | G11C 16/28 365/207 |
| 8,570,809 B2 | 10/2013 | Hirose et al. | |
| 9,906,218 B1 * | 2/2018 | Stephens, Jr. | G11C 7/22 |
| 10,032,517 B2 | 7/2018 | Hirose et al. | |
| 10,176,878 B2 * | 1/2019 | Ihm | G11C 16/24 |
| 2013/0170292 A1 | 7/2013 | Georgescu et al. | |
| 2014/0211558 A1 | 7/2014 | Kurokawa | |
| 2014/0369136 A1 | 12/2014 | Hirose et al. | |
| 2015/0357036 A1 | 12/2015 | Park | |
| 2016/0365147 A1 | 12/2016 | Georgescu et al. | |
| 2017/0372795 A1 | 12/2017 | He | |
| 2020/0066352 A1 | 2/2020 | Georgescu et al. | |

* cited by examiner

*Primary Examiner* — Son L Mai

(74) *Attorney, Agent, or Firm* — Slater Matsil, LLP

(57) ABSTRACT

In accordance with an embodiment, a method for characterizing a non-volatile memory, includes: applying a first voltage on a word line conductively coupled to a non-volatile memory cell and measuring a current flowing through the non-volatile memory cell in response to applying the first voltage. Measuring the current includes: using a sense amplifier, comparing the current flowing through the non-volatile memory cell with a plurality of different first currents generated by an adjustable current source while applying the same first voltage on the word line, and determining the measured current based on the comparing.

27 Claims, 8 Drawing Sheets

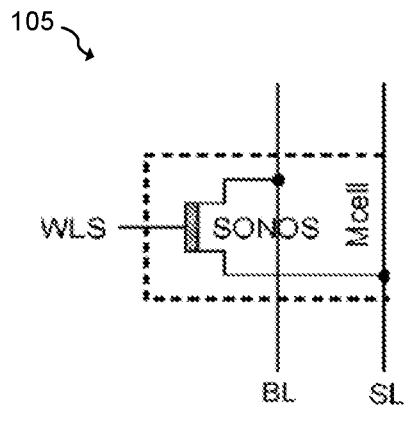
FIG. 5A
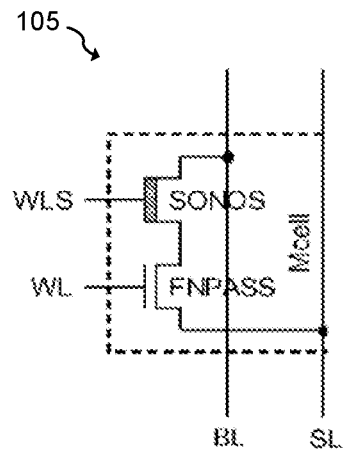
FIG. 5B
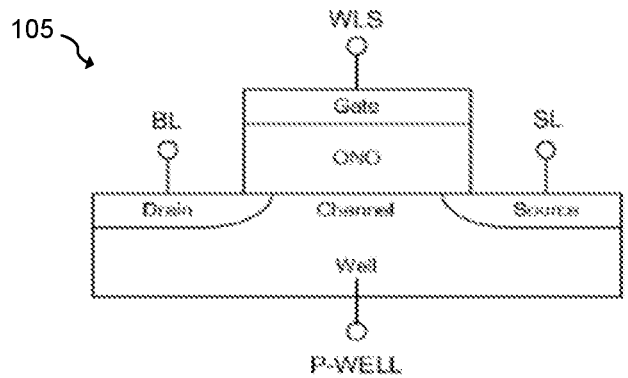
FIG. 5C
|  | 1T | | | 2T | | |
| --- | --- | --- | --- | --- | --- | --- |
|  | Read | Erase | Program | Read | Erase | Program |
| WL | NA | NA | NA | VPWR* / 0 | VPWR* / 0 | VWL* |
| WLS | 0 / -2* | VNEG / VPOS | VPOS / VNEG | 0 | VNEG / VPOS | VPOS / VNEG |
| BL | VLIM / 0 | VPOS | VNEG / VBL* | VLIM / 0 | VPOS | VNEG / VBL* |
| SL | 0 | VPOS* | VNEG / VBL* | 0 | VPOS* | VNEG / VBL* |
| P- Well | -2* | VPOS | VNEG | 0 | VPOS | VNEG |
FIG. 5D

SYSTEM AND METHOD FOR TESTING A NON-VOLATILE MEMORY

TECHNICAL FIELD

The present invention relates generally to an electronic system and method, and, in particular embodiments, to a system and method for testing a non-volatile memory.

BACKGROUND

Programmable non-volatile memories (NVM) are useful in many applications because they retain stored information even when power is removed from the memory. There are many different types of programmable non-volatile memory including, but not limited to, programmable read only memory (PROM), electrically erasable ROM (EEPROM) and Flash memory. These memory types have several methods of charge storage including but not limited to placing charge on a Floating Gate or Silicon-Oxide-Nitride-Oxide-Silicon (SONOS) storage material or node. Like other types of memory, programmable NVMs are usually constructed as an array of bit cells arranged in rows and columns. Each bit cell may include one, split gate, or two transistors (i.e., 1T, 1.5T, or 2T cells). During programming, charge is injected into the storage node of one of the transistors. During normal operation of the NVM, bit cells are read by selecting a row of bit cells via a word line (WL) and measuring output currents of each bit cell via sense amplifiers coupled to bit lines.

In practical memory applications, the device characteristics of the bit cells may vary with respect to semiconductor process parameters and may vary randomly with respect to each other. Hence, in some applications, the threshold of each bit cell is measured to determine read parameters, write parameters and sense amplifier threshold currents. In addition, some bit cells may be defective and require replacement using redundant bit cells. However, given the large size of modern non-volatile memories, it can take a long time to measure and characterize each cell, which results in increased test cost.

SUMMARY

In accordance with an embodiment, a method for characterizing a non-volatile memory, includes: applying a first voltage on a word line conductively coupled to a non-volatile memory cell and measuring a current flowing through the non-volatile memory cell in response to applying the first voltage. Measuring the current includes: using a sense amplifier, comparing the current flowing through the non-volatile memory cell with a plurality of different first currents generated by an adjustable current source while applying the same first voltage on the word line, and determining the measured current based on the comparing.

In accordance with another embodiment, a memory system includes: an integrated circuit having: a memory array including non-volatile memory cells, a plurality of word line drivers coupled to the memory array, a plurality of sense amplifiers coupled to the memory array and coupled to an external data bus, an adjustable current source coupled to the plurality of sense amplifiers, a first control circuit, and a second control circuit. The first control circuit is configured to set the adjustable current source to a test current, and apply a first address to the memory array to select a row of the non-volatile memory cells; and the second control circuit configured to: read outputs of the sense amplifier, and iteratively update the test current based on outputs of the sense amplifier to determine a current flowing through at least one non-volatile memory cell of the row of the non-volatile memory cells.

In accordance with a further embodiment, a method of characterizing a non-volatile includes: operating the non-volatile memory in a test mode including: performing a test read of the non-volatile memory including: applying a row address to non-volatile memory to select a row of non-volatile memory cells, grounding word lines coupled to the selected row of non-volatile memory cells, measuring a current of least one non-volatile memory cell of the row of non-volatile memory cells with the word lines grounded, and incrementing the row address; and repeating the performing of the test read using the incremented row address.

BRIEF DESCRIPTION OF THE DRAWINGS

For a more complete understanding of the present invention, and the advantages thereof, reference is now made to the following description taken in conjunction with the accompanying drawings, in which:

FIGS. 5A, 5B and 5C illustrate example memory cells that could be used to implement a non-volatile memory array according to embodiments of the present invention; and FIG. 5D is a cross-section illustrating an embodiment of an N-type SONOS transistor.

Figure 1A:
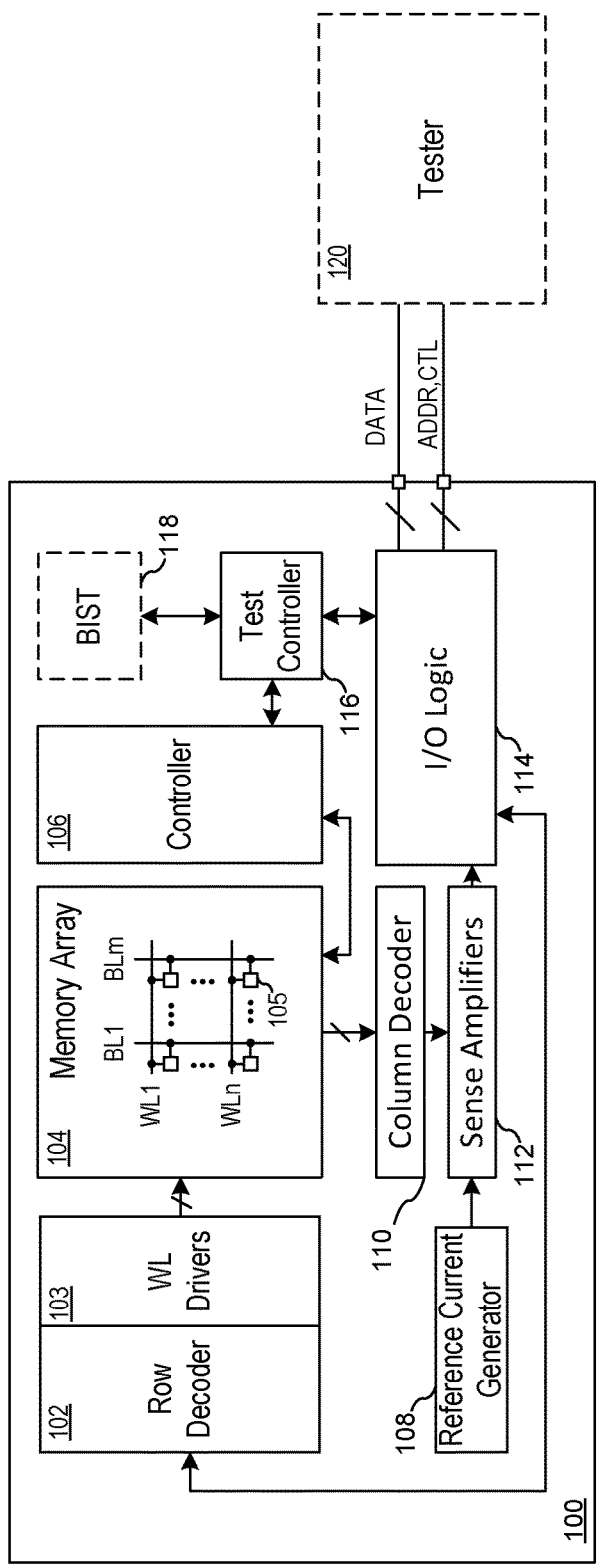
FIG. 1A illustrates a block diagram of an embodiment memory system.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, a non-volatile memory array is characterized by grounding the word lines of each row of memory cells and measuring the output current of each non-volatile memory cell. The current measurement may be performed by iteratively comparing the output current of each memory cell with an adjustable reference current using a sense amplifier to estimate the output current of the non-volatile memory cells. In some embodiments, these measurements may be made rapidly on a row-by-row basis using the existing sense amplifiers, external data bus, and sense amplifier current reference circuitry of the non-volatile memory used during the normal read operation of the memory.

Grounding the word lines in a non-volatile memory array during testing allows for faster characterization of the memory cells compared to conventional systems that measure memory cell thresholds by applying a variable voltage to the word lines. Conventional systems require additional time to charge and discharge the higher voltages applied to the word lines before and after each measurement. Embodiment memory systems also have a size advantage over conventional systems because the word line drivers do not need to include high-voltage circuitry for applying test voltages to the word lines. Using smaller word line drivers reduces silicon area and lowers costs.

FIG. 1 illustrates an embodiment memory system that includes integrated circuit 100 having a non-volatile memory. As shown, integrated circuit 100 includes memory array 104, row decoder 102, word line drivers 103, controller 106, sense amplifiers 112, column decoder 110, I/O logic 114 coupled to an external data bus, reference current generator 108 and test controller 116. Reference current generator 108 may also be referred to as an adjustable current source. In some embodiments, integrated circuit 100 may be coupled to an external tester 120 while memory array 104 is being characterized. Alternatively, or in addition to tester 120, integrated circuit 100 may also include a built-in self-test (BIST) circuit 118 that performs one or more characterization functions for memory array 104. BIST circuit 118 and tester 120 are shown in dashed lines to indicate that these blocks may or may not be present in some embodiments.

In various embodiments, the components of integrated circuit 100 may be disposed on a single monolithic semiconductor integrated circuit, such as a single semiconductor substrate, and/or on the same monolithic semiconductor integrated circuit as other disclosed system components.

As shown, memory array 104 includes an array of non-volatile memory cells 105. Each non-volatile memory cell 105 is connected to a respective word line (WL1 . . . WLn) and to a respective bit line (BL1 . . . BLm). During normal operation of the memory, row decoder 102 decodes a row address based on address data ADDR provided at the input to I/O logic 114. The decoded row address is used to select one of word lines (WL1 . . . WLn) via word line drivers 103, which activates a row of memory cells 105 that generate respective read currents on respective bit lines (BL1 . . . BLm). The current of each bit line is compared to a reference current produced by reference current generator 108 using sense amplifiers 112. Column decoder 110 selects columns of memory array 104 to be routed to sense amplifiers 112, the output of which is routed to data lines DATA via I/O logic 114. Controller 106 is a memory controller that controls the operation of the memory. In some embodiments, reference current generator 108 may be implemented using a current digital-to-analog converter (CDAC).

In various embodiments, non-volatile memory cells 105 of memory array 104 are measured in order to (1) characterize the thresholds of programmed and/or unprogrammed memory cells; (2) determine operational parameters of the memory such as sense amplifier threshold, and programing times, etc.; and/or (3) identify non-functional memory cells to be replaced by redundant memory cells.

As mentioned above, in various embodiments, the state of each memory is evaluated by determining whether or not a read current of each memory cell is greater or less than a threshold current. FIG. 1B illustrates a diagram that shows an example distribution for read currents for N memory cells, which may represent, for example, N memory cells 105 within a row of non-volatile memory array 104.

As shown, each memory cell produces a first lower current when the memory cell is written to a "1" state 134, and produces a second higher current when the memory cell is written to a "0" state 132. In one alternative embodiment, the assignment of binary states "0" and "1" may be reversed. Current $I_{NOM0}$ represents an average or nominal current of the N memory cells when written to the "0" state, and current $I_{NOM1}$ represents an average or nominal current of the N memory cells when written in the "1" state. Current $I_{THRESH}$ represents a threshold current used by sense amplifiers 112 during a read operation to determine whether a particular bit is written to the "0" state or to the "1" state. For example, during a read operation, the sense amplifier determines that a memory cell 105 is written to a "0" state when the current produced by the memory cell is greater than threshold current $I_{THRESH}$, and determines that the memory cell 105 is written to a "1" state when the current produced by the memory cells is less than threshold current $I_{THRESH}$.

In practical memory systems, the actual currents $I_{NOM0}$ and $I_{NOM1}$ produced by each memory cell may vary during operation due to changes in temperature, power supply voltages, aging of the memory cells, and operational memory parameters including, but not limited to writing duration and writing voltage. As such, the memory is designed to have some current margin $I_{MARG}$ between the nominal "0" written current $I_{NOM0}$ and threshold current $I_{THRESH}$, and between the nominal "1" written current $I_{NOM1}$ and threshold current $I_{THRESH}$. Margin current $I_{MARG}$ may be selected to ensure adequate noise margin, and accurate operation over a specified range of temperatures and power supply voltages. This margin may be ensured by selecting threshold current $I_{THRESH}$ to meet predetermined margin requirements, and is shown in FIG. 1B as dotted lines designated as $I_{NOM0}-I_{THRESH}$ for the "0" written bits, and $I_{NOM1}+I_{MARG}$ for the "1" written bits. In various embodiments, "0" written bit that produce a measured current greater than $I_{NOM0}-I_{THRESH}$ and "1" written bit that produce a measured current less than $I_{NOM0}+I_{THRESH}$ are considered to have adequate margin. For example, outlier measurement 136 of the "0" written bits is within the current margin $I_{MARG}$ because its associated current is greater than $I_{NOM0}-I_{THRESH}$. On the other hand, outlier measurement 138 of the "1" written bits is outside of the current margin $I_{MARG}$ because its associated current is greater than $I_{NOM1}+I_{THRESH}$.

In various embodiments, the measurements of the currents of one or more memory cells are determined by iteratively setting the current thresholds of sense amplifiers 112, and reading the output of sense amplifiers 112. For example, in an embodiment, the current generated by reference current generator is set to a first current value to compare against a particular current threshold. Next, a row of memory cells is read using the first current value. The resulting read values provides indication of which memory cells produce current above and below the first current value. For example, referring to FIG. 1B, if the first current value were to be set to $I_{NOM1}+I_{MARG}$ after the row of memory cells were written to have "1" values, all of the measured memory cells would return a "1" value except for bit 138, which would return a "0" value indicating that its current is greater than the first current value. This information could be used, for example, to replace bit 138 with a redundant memory cell or replace the entire row with a redundant row of memory cells.

In various embodiments, the memory cells in the row of memory cells may be written to a "1" value, a "0" value, or a combination of "1" and "0" values according to a particular pattern. For example, in one embodiment, all of the memory cells of a particular row are written to have "0" values. Next, the reference current generated by reference current generator 108 is successively varied to determine one or more current levels of the written memory cells using a "linear search." For example, with reference to FIG. 1B, the initial reference current could be greater than current $I_{NOM0}$ such that the initial measurement returns a set of measurements indicating that memory cells in the row have a current level less than the initial reference current. During each subsequent measurement, the reference current is successively lowered such that the returned measurements indicate a mix of memory cells having currents above and below the reference current. For example, when the reference current is at $I_{NOM0}$, the memory cells having currents above $I_{NOM0}$ returns a value of "0," while the memory cells having currents below $I_{NOM1}$ return a value of "1." The current of a particular memory cell may be estimated to be a current that lies between a first reference current at which a "0" is returned and a second reference current at which a "1" is returned. These measurements may continue until the current for each memory cell is determined. For example, once the reference current is below the current for outlier memory cell 136, all memory cells return a "0" value. In an alternative embodiment, the linear search could be started at a lower current (e.g. below $I_{NOM0}-I_{MARG}$) and successively increase.

In some embodiments, the currents of a subset of the memory cells may be estimated. For example, the current threshold may be iteratively adjusted to determine the "worst case" memory cell written as a "0" (e.g. memory cell 136) or determine a predetermined number of "worst case" memory cells having minimum currents and then conclude the memory measurement.

In some embodiments of the present invention, different search techniques could be applied besides the linear search technique described above. For example, the current of a particular memory cell could be successively approximated using a binary search algorithm. In such an embodiment in which the reference current generator 108 is implemented using a CDAC, the CDAC is initialized to an initial DAC word in which the MSB of the DAC is set to "1" and the remaining least significant bits are set to "0." Given the case in which all bits are written to "0," when the measurement of the particular bit indicates a "0," meaning that the reference current is less than the current produced by the particular memory cell, the MSB and the second most significant bit of the CDAC are set to a "1" for the next measurement. On the other hand, when the measurement of the particular bit indicates a "1" meaning that the reference current is greater than the current produced by the particular memory cell, the MSB is set to "0" and the second most significant bit of the CDAC is set to a "1" for the next measurement. Measurements proceed on a bit-by-bit basis until all bits of the CDAC input word have been exercised. In some embodiments, the CDAC word may be stored and modified using a successive approximation register according to well-known successive approximation techniques known in the art. In such embodiments, the final value stored in the successive approximation register at the end of the measurement represents the estimated value of the memory cell.

In some embodiments, the measurement results of a plurality of memory cells may be used to determine the reference current when performing a binary search to identify one or more outlier memory cells and/or in order to identify and measure a current of a "worst case" memory cell. In such embodiments, the binary search may be performed to minimize a number of bits that produce a "1" value in the case of bits being pre-programmed to the "0" state. For example, the current used for each successive approximation trial may be determined by comparing a number of "1" values produced between two successive cycles in order to converge to a current value that in which a single memory cell (e.g. outlier 136) returns a "1" value, while the remaining memory cells return "0" values. In other words, the system is configured to find the cell (or cells) with the lowest erase current.

While the above current estimation techniques are described with respect to measuring memory cells written to the "0" value, it should be understood that similar measurement techniques could also be used to measure memory cells written to the "1" value. In such embodiments, the polarity of the measurements of the corresponding measurement sequences are reversed and adjusted to accommodate the reversed programed polarity. For example, instead of determining a current of an outlier cell having a minimum current, the current of one or more outlier cells (e.g., cell 138) having a maximum current is determined.

Each measurement may be controlled, for example, using BIST 118, tester 120, controller 106, test controller 116 or a combination thereof. For example, one of these controllers provides a row address to row decoder 102, analyzes the resulting data output by sense amplifiers 112, and determines a next current to be produced by reference current generator 108. In embodiments in which the test operation is controlled by external tester 120 during a test mode, the row address of the test row may be provided via address bits ADDR, and the measured bits may be read via data bus DATA coupled to I/O logic 114. Reference current generator 108 and operation of embodiment test modes may be controlled by tester 120 via control bus CTL coupled to I/O logic 114. In some embodiments, the various test sequences may be controlled, in part, by test controller 116. For example, when tester 120 places integrated circuit 100 in a characterization test mode, test controller 116 may configure controller 106 to apply the requisite test control sequence, and configure reference current generator 108 to adjust its reference current to a requested test current or to a sequence of test currents as described above. In some embodiments, tester 120 may provide only an initial row address for a characterization. In such embodiments, the row address may be incremented internally by test controller 116 and/or BIST 118 after each measurement on a row-by-row basis.

In some embodiments, tester 120 may analyze the output of each measurement iteration described above, and determine a next current value to be provided by reference current generator 108. In alternative embodiments, the analysis of each measurement iteration and/or the determination of the next current value may be implemented internally by BIST 118. In some embodiments, the entire characterization method may be performed internally by BIST 118, and the results of the characterization may be made externally available via I/O logic 114.

In various embodiments, the characterization results may be tabulated in a variety of formats. In one embodiment, the characterization results may include a list of memory cell address location and their associated current threshold values. This list may detail each memory cell in each or a subset of memory cells in each row, such as one or more "worst case" memory cells and their associated current threshold values. These current threshold values may be expressed in terms of CDAC input words provided to reference current generator 108 and/or may be converted to an equivalent current threshold and/or an equivalent threshold voltage value based on other physical measurements or characterization data. This conversion may be implemented using, for example, a database, a lookup table or other data conversion methods known in the art.

The memory systems describe herein may be implemented in a variety of semiconductor processes, such as a standard CMOS process and/or a CMOS process that has been modified to accommodate one or more particular types of non-volatile memory. While embodiments of the memory architecture will be described herein with respect to silicon-oxide-nitride-oxide-silicon (SONOS) devices developed, for example, in accordance with Infineon's SONOS process technology, other embodiments of the invention are not so limited and may include substantially any type of memory cell developed in accordance with substantially any non-volatile process technology.

Figure 2A:
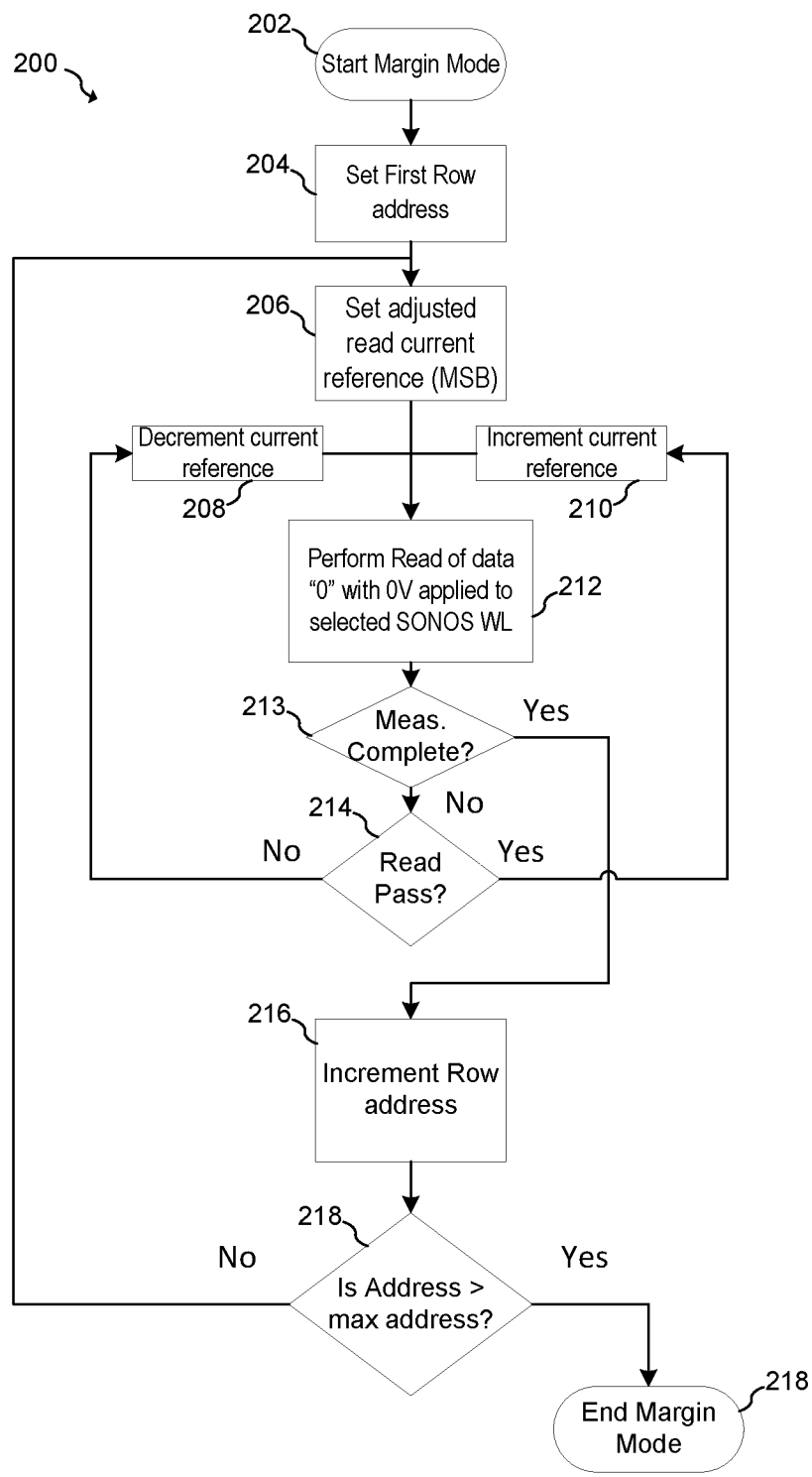
FIGS. 2A and 2B illustrate flow charts of methods according to embodiments of the present invention.
Figure 2B:
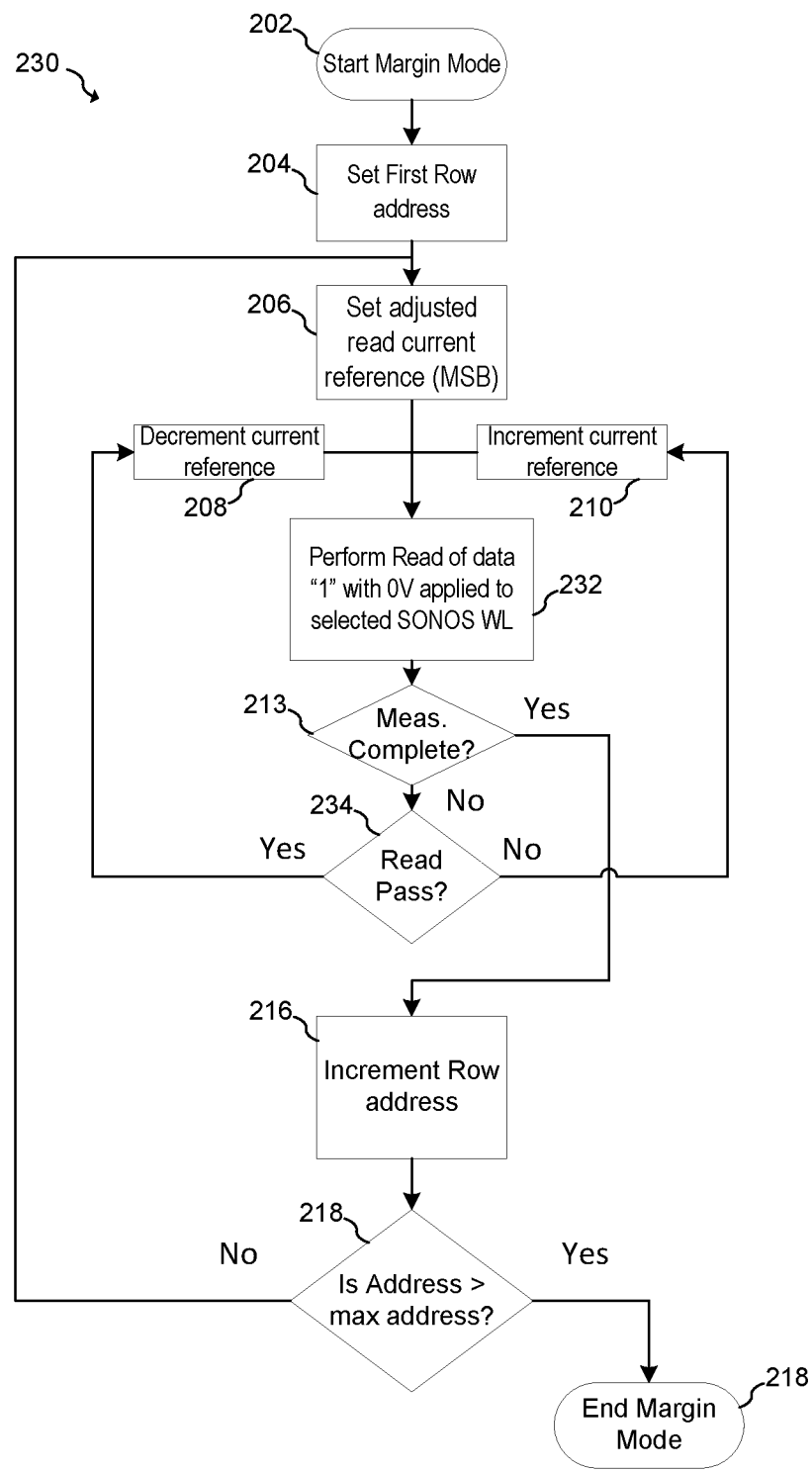

FIGS. 2A and 2B illustrate flow charts of methods according to embodiments of the present invention. More specifically, FIG. 2A illustrates a method 200 of characterizing a non-volatile memory array in which each memory cell under test has been written with a "0," and FIG. 2B illustrates a method 230 of characterizing a non-volatile memory array in which each memory cell under test has been written with a "1." In various embodiments, methods 200 and 230 may be performed under the control of test controller 116, BIST 118 and/or tester 120 depending on the implementation of the particular system and its specifications.

Turning to FIG. 2A, method 200 starts when a "margin mode" (e.g., a mode in which the memory cells are characterized) is entered in step 202. This margin mode may be entered externally via a command provide via control lines CTL to I/O logic 114 shown in FIG. 1A. Next, in step 204, a first row address is provided to row decoder 102. As discussed above, this row address may be provided by tester 120, BIST 118 and/or test controller 116. In step 206, a first initial read current reference is set, for example, by providing a first CDAC input word to reference current generator 108. This first initial read current may correspond, for example, to the first (e.g., MSB) estimate of a binary search successive approximation.

Once the initial adjusted current has been set, the word line of the selected row is set to a reference voltage such as 0 V (e.g. ground voltage) and a first measurement of the selected row is made in step 212 by performing a read of the memory. The resulting memory outputs (e.g., the output of sense amplifiers 112) for the selected row is analyzed to determine whether the read passes a first set of conditions. In some embodiments, a read pass is defined as a memory read producing all "0s" for each memory cell in the row of memory cells. If a read pass is encountered in step 214, the reference current produced by reference current generator 108 is increased in step 210 and step 212 is repeated with an increased reference current. In some implementations, the reference current is increased by incrementing a digital word provided to a CDAC of reference current generator 108. On the other hand, if a read pass is not encountered in step 214 (e.g. one or more bits returned by the memory read indicates a "1"), the reference current produced by reference current generator 108 is decreased in step 208, and step 212 is repeated with the decreased reference current. The reference current may be decreased, for example, by decrementing a digital word provided to the CDAC of reference current generator 108.

In various embodiments, steps 212, 214, and steps 208 and/or 210 are repeated until the measurement is complete in step 213. In some embodiments, the measurement is complete when all the bits controlling the CDAC have been toggled and the current of the memory cell is determined (within the CDAC's precision), at which point the method proceeds to step 216 in which the row address is incremented. If the measurement is not complete, the method proceeds to step 214 as described above. In embodiments that utilize column decoders such as column decoder 110 shown in FIG. 1A, the current column decoder setting may be successively incremented in step 216 in order to read an entire row prior to the row address being incremented.

During step 218, a determination is made as to whether the incremented row address is greater than a predetermined maximum address. If the incremented row address is not greater than the maximum row address, then the method proceeds to step 212 in which the row corresponding to the incremented row address is measured. On the other hand, if the incremented row address is greater than the maximum row address, the margin mode is exited in step 218. The predetermined maximum address may be the maximum address for the non-volatile memory or may be a different address in embodiments in which only a subset of memory rows is measured.

Method 230 shown in FIG. 2B is similar to method 200 shown in FIG. 2A with the exception that the memory cells of a particular row are written to have a value of "1." As such, steps 212 and 214 are respectively replaced by steps 232 and 234. In step 234, the word line of the selected row is set to 0 V (e.g., ground voltage) and a first measurement of the selected row is made in step 234 by performing a read of the memory. The resulting memory outputs (e.g., the output of sense amplifiers 112) for the selected row is analyzed to determine whether the read passes a first set of conditions. In some embodiments, a read pass is defined as a memory read producing all "is" for each selected memory cell in the row of memory cells accessed. If a read pass is encountered in step 234, the reference current produced by reference current generator 108 is decreased in step 208, and step 232 is repeated with a decreased reference current. On the other hand, if a read pass is not encountered in step 234 (e.g. one or more bits returned by the memory read indicates a "0"), the reference current produced by reference current generator 108 is increased in step 210, and step 234 is repeated with an increased reference current. Operation of the remaining steps of method 230 proceeds as described above with respect to method 200 of FIG. 2A.

Figure 3A:
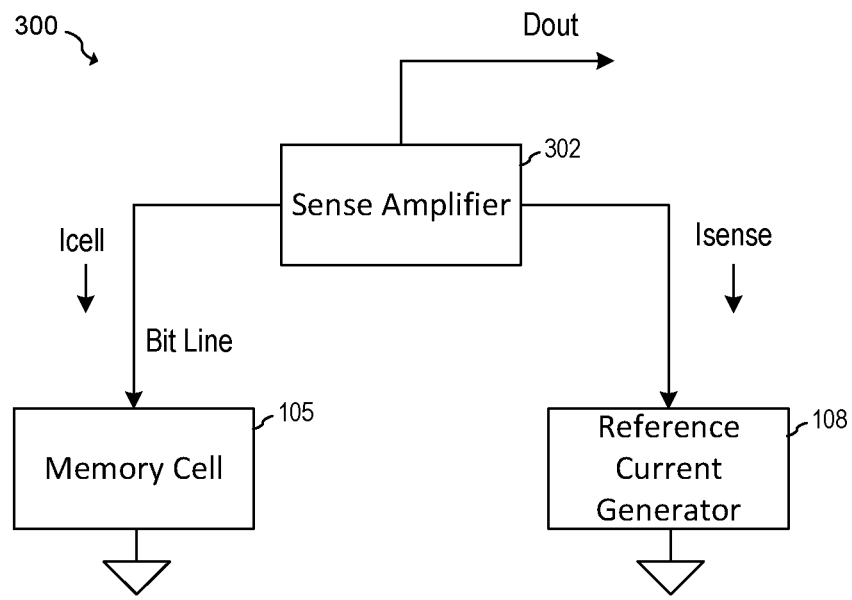
FIG. 3A illustrates a block diagram showing the operation of a sense amplifier according to an embodiment.

FIGS. 3A, 3B, 3D, 3E and 3F illustrate circuits that may be used to implement memory systems according to embodiments of the present invention. FIG. 3A illustrates an embodiment memory sensing system 300 that includes memory cell 105 corresponding to a memory cell in memory array 104 shown in FIG. 1A, sense amplifier 302 corresponding to a sense amplifier included among the plurality of sense amplifiers in sense amplifier block 112 shown in FIG. 1A, and reference current generator 108 corresponding to reference current generator in FIG. 1A.

Memory cell 105 may be a non-volatile memory cell, such as a floating gate memory cell or SONOS memory, that is configured to produce an output current Icell that depends on a memory state of the memory cell. For example, when memory cell 105 is in a programmed state (e.g. a "1" state), a lower bit line current Icell is produced. On the other hand, when memory cell 105 is in an erased or "0" state, a higher bit line current Icell is produced. Accordingly, sense amplifier 302 can be used to determine the state of memory cell 105 by comparing the output current Icell of memory cell 105 provided to a sense input of sense amplifier 302 with a reference current Isense generated by current generator 108 provided to a reference current input of sense amplifier 302.

During operation, sense amplifier 302 produces a first logical state with respect to output signal Dout when output current Icell of memory cell 105 is less than reference current Isense, and produces a second logical state when output current Icell is greater than reference current Isense. The first and second logical states could be respectively referred to as a "low" state and a "high" state, or a "0" state and a "1" state. In some embodiments, this designation could be reversed such that the first and second logical states are respectively referred to as a "high" state and a "low" state, or a "1" state and a "0" state.

Memory cell 105 and sense amplifier 302 may be constructed using memory cell and sense amplifier circuits known in the art. For example, memory cell 105 could be a SONOS or charge trapping memory cell or a floating gate memory cell, and sense amplifier 302 may be implemented using a cross-coupled CMOS latch circuit. In alternative embodiments, other memory cell and sense amplifier circuits could be used. Reference current generator 108 may be implemented using a CDAC, such as CDAC 360 described below with respect to FIG. 3F.

Figure 1B:
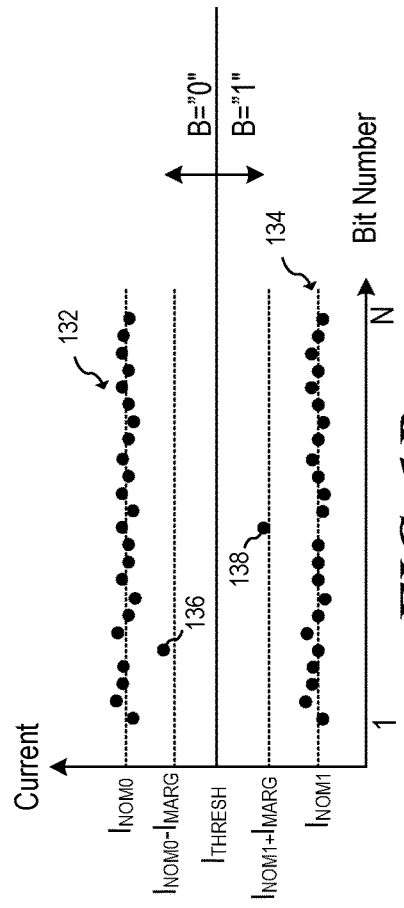
FIG. 1B illustrates a diagram that shows an example read current distribution for N memory cells.
Figure 3B:
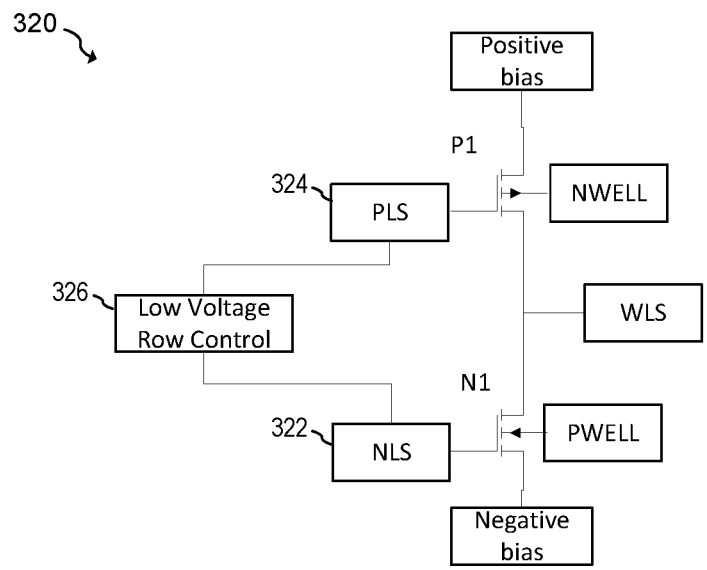
FIG. 3B illustrates a schematic of a word line driver according to an embodiment.

FIG. 3B illustrates an embodiment word line driver circuit 320 that could be used to implement each of the plurality of word line driver circuits within word line driver block 103 shown in FIG. 1A. As shown, word line driver 320 includes a p-channel MOS transistor P1 coupled between a positive bias node (also referred to as a "positive supply node") and a word line driving node WLS, and an n-channel MOS transistor N1 could between word line driving node WLS and a negative bias node (also referred to as a "negative supply node:). The positive bias node and the negative bias node are respectively coupled to a positive and a negative power supply circuit (e.g. a positive charge pump and a negative charge pump.) In some embodiments, body connection NWELL of p-channel MOS transistor P1 may be coupled to the positive bias node, and body connection PWELL of n-channel MOS transistor N1 may be coupled to the negative supply node.

A negative level shifter 322 and a positive level shifter 324 respectively provide gate drive signals to the gates of p-channel MOS transistor P1 and n-channel MOS transistor N1 based on signals received from low voltage row control block 326. In one embodiment, low voltage row control block 326 represents an output stage of row decoder 102 shown in FIG. 1A. During normal memory read and write operations, the positive and negative bias nodes provide the requisite voltages to word line WLS as described below with respect to FIGS. 5A, 5B, 5C and 5D. However, during embodiment memory cell characterization operations described herein, the negative bias node is set to a ground voltage such that word line WLS is grounded.

Figure 3C:
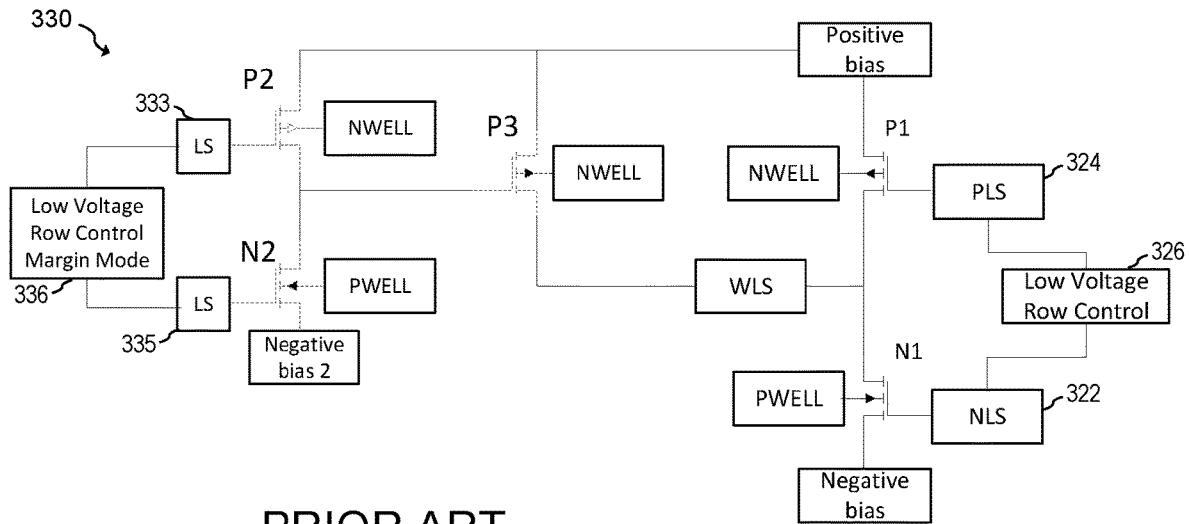
FIG. 3C illustrates a schematic of a conventional word line driver.

Embodiment device characterization systems and methods that allow for word line grounding during memory cell characterization are advantageous because they allow for the use of physically compact word line drivers. This is in contrast to voltage mode characterization systems and methods, which apply a variable voltage to the word line and require additional circuitry to perform memory cell characterization. To determine the voltage thresholds of the memory cells, a wide range of voltages is applied to the measured memory cells. In some cases, devices that are rated to handle higher voltages are used to provide these voltages during characterization. In some embodiments, each of these devices may be comprised of multiple devices connected together and take up a large amount of silicon area. FIG. 3C illustrates a conventional word line driver that includes transistors P1 and N1, and level shifters 322 and 324 along with additional circuitry to support the application of a wider positive voltages range to the word line via p-channel MOS device P3. Additional circuitry further includes p-channel MOS devices P2, n-channel MOS device N2, and level shifters 333 and 335 that receive input from low voltage row control margin mode block 336. Conventional word line driver 330 includes more devices than embodiment word line driver 320. In various embodiments of the present invention, embodiment word line drivers are physically smaller than conventional word line drivers used in voltage mode device characterization.

Figure 3D:
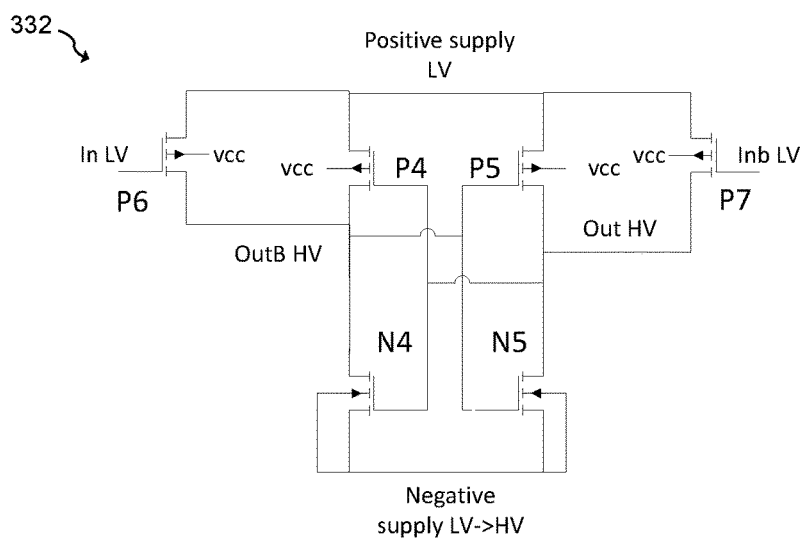
FIGS. 3D and 3E illustrate schematics of embodiment level shifters.
Figure 3E:
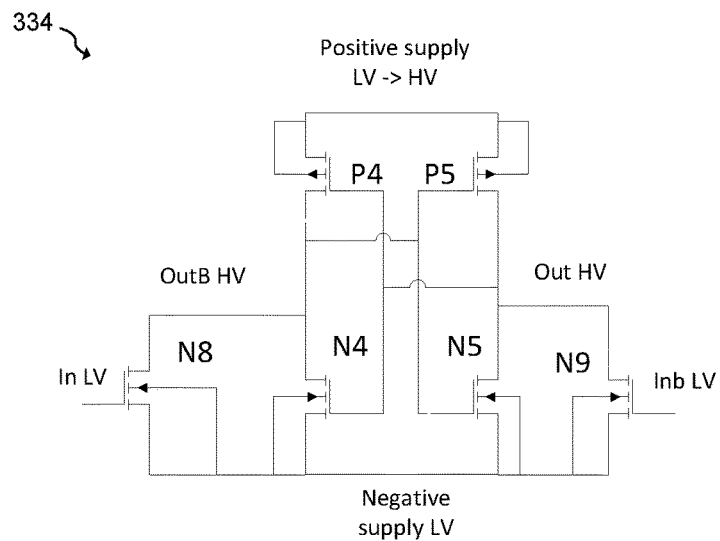

FIGS. 3D and 3E illustrate level shifter circuits 332 and 334 that can be respectively used to implement negative and positive level shifter circuits 322 and 324 of word line driver 320 shown in FIG. 3B. FIG. 3D shows a negative level shifter 332 configured to convert a low-level logic signal (e.g. 0 V to 1V) to a high-level logic signal having a signal swing between the negative supply and the positive supply (e.g. −3 V to 0/1 V). In various embodiments, the voltage range at the output of negative level shifter circuit 332 is sufficient to drive the gate of n-channel MOS transistor N1 (FIG. 3B), which serves as a high-side switching transistor. Negative level shifter 332 includes a cross-coupled latch that includes p-channel MOS transistors P4 and P5 and n-channel MOS transistors N4 and N5, and input p-channel MOS transistors P6 and P7 that serve as input transistors. During operation, a low-level logic input IN LV is applied to the gate of p-channel MOS transistor P6, and an inverted low-level logic input Inb LV is applied to the gate of p-channel MOS transistor P7. The resulting currents provided by transistors P6 and P7 cause the cross-coupled latch circuit to provide a high-level logic signal at output node Out HV, and an inverted high-level logic signal OutB HV.

Turning to FIG. 3E a positive level shifter 334 configured to convert a low-level logic signal (e.g. 0 V to 1 V) to a high-level logic signal having a signal swing between the negative supply and the positive supply (e.g. 0/1V to 4V) is shown. In various embodiments, the voltage range at the output of positive level shifter circuit 334 is sufficient to drive the gate of p-channel MOS transistor P1 (FIG. 3B), which serves as a low-side switching transistor. Positive level shifter 334 includes a cross-coupled latch that includes p-channel MOS transistors P4 and P5 and n-channel MOS transistors N4 and N5, and input n-channel MOS transistors N8 and N9 that serve as input transistors. During operation, a low-level logic input IN LV is applied to the gate of N-channel MOS transistor N8, and an inverted low-level logic input Inb LV is applied to the gate of N-channel MOS transistor N9. The resulting currents provided by transistors N8 and N9 cause cross-coupled latch circuit to provide a high-level logic signal at output node Out HV, and an inverted high-level logic signal OutB HV.

It should be understood that level shifter circuits 332 and 334 shown in FIGS. 3D and 3E are two examples of many possible level shifter circuits that could be used to implement the level shifting functionality of word line driver 320.

In alternative embodiments of the present invention, other level shifting circuits known in the art could be used.

Figure 3F:
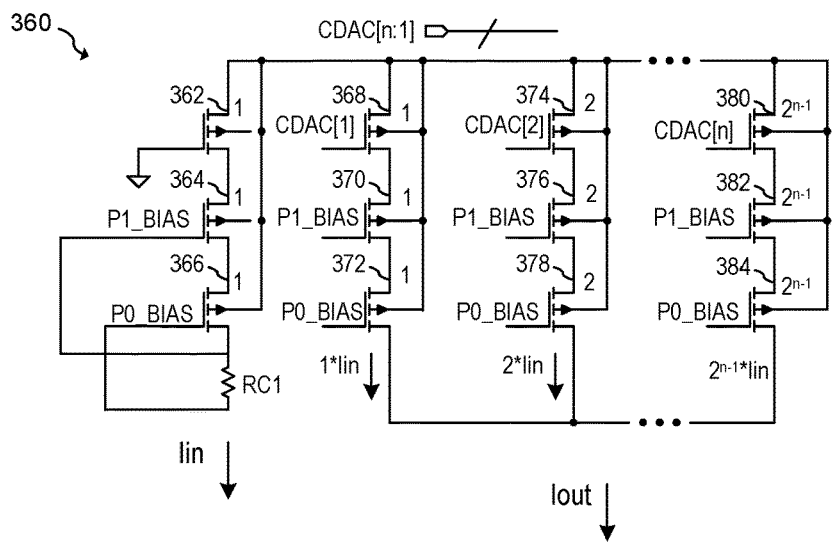
FIG. 3F illustrates a schematic of an embodiment reference current generator.

FIG. 3F illustrates a CDAC circuit 360 that could be used to implement reference current generator 108 shown in FIG. 1A. As shown, CDAC circuit 360 is configured to provide an output current Iout based on an n-bit digital input word CDAC[n:1]. In one embodiment of the present invention CDAC 360 is an 8 bit CDAC; however, other bit resolutions may be used in other embodiments depending on the particular embodiment and its specifications.

As illustrated, CDAC circuit 360 is implemented as a binary weighed having n binary weighted output branches and bias branch. The bias branch includes p-channel MOS transistors 362, 364 and 366 and resistor RC1. The current source Iin provides a bias voltage P0_BIAS to transistor 366 in the input branch and transistors 372, 378 and 384 in the output branches. The output of resistor RC1 provides a bias voltage P1_BIAS to transistor 364 in the input branch and transistors 370, 376 and 382 in the output branches, and transistor 362 is used to match the on-resistance of select transistors 368, 374 and 380 in the output branches. As shown, transistors 362, 364 and 366 each have a relative size of one unit and are configured to receive DC bias current Iin. A first output branch includes cascode transistor 372, current source transistor 370 and select transistor 368 that is activated when the LSB of digital input word CDAC[n:1] is asserted. As shown, transistors 368, 370 and 372 have the same sizes as transistors 362, 364 and 366 of the bias branch such that the first branch produces a current of 1*Iin when the branch is active. A second output branch includes cascode transistor 378, current source transistor 376 and select transistor 374 that is activated when the second least most significant bit of digital input word CDAC[n:1] is asserted. As shown, transistors 374, 376 and 378 are twice the size as transistors 362, 364 and 366 of the bias branch such that the second branch produces a current of 2*Iin when the branch is active. An $n^{th}$ output branch includes cascode transistor 384, current source transistor 382 and select transistor 380 that is activated when the MSB of digital input word CDAC[n:1] is asserted. As shown, transistors 380, 382 and 384 are n times the size as transistors 362, 364 and 366 of the bias branch such that the $n^{th}$ branch produces a current of $2^{n-1}$*Iin when the branch is active. Additional binary weighted branches having weightings between 4 and $2^{n-2}$, if applicable, but are not shown for simplicity of illustration. In some embodiments, CDAC circuit 360 may be implemented using equally weighted segments or using a combination of equally weighted and binary weighted segments depending on the specifications of the particular embodiment. In further alternative embodiments, other CDAC circuits and architectures known in the art may also be used.

Figure 4:
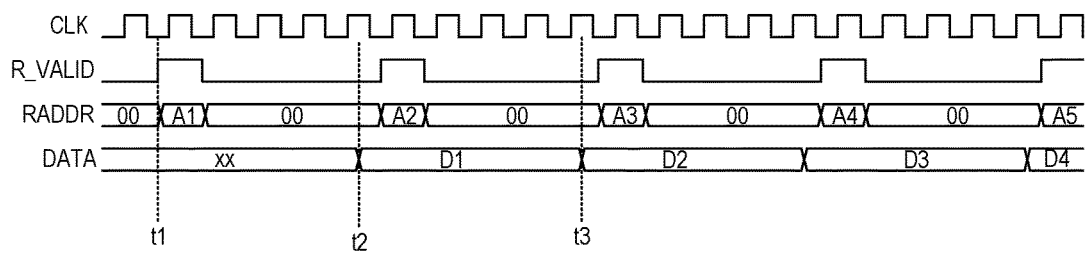
FIG. 4 illustrates a timing diagram according to an embodiment.

FIG. 4 illustrates a timing diagram showing the state of row address lines RADDR and data lines DATA coupled to the I/O logic 114 from FIG. 1A during an embodiment memory cell characterization procedure, when memory array 104 is being read. Clock signal CLK, representing the system clock of the memory system, and signal R_VALID, a control signal which is asserted when an initial row address is written to the test memory system, are also depicted. At time t1 when R_VALID is asserted, an initial row address A1 is written to the row address lines RADDR. This causes the first measurement represented by data word D1 to appear on the data lines DATA at time t2, with the length of each word matching the width of the row or the width of the selected columns that is measured. For example, in an embodiment in which 128 sense amplifiers are coupled to the selected columns and/or in an embodiment that uses 128 sense amplifiers coupled to a 128 bit wide row, the width of data words D1, D2, D4 and D4 would each be 128-bits. Five clock cycles later, the initial row address A1 is incremented to A2 and applied to the row decoder 102 and the corresponding data word D2 appears on the data lines DATA at time t3. This process is repeated until the memory 104 is completely read. In embodiments that utilize a column decoder, such as column decoder 110 shown in FIG. 1A, the separate reads are performed for each column selected until an entire row is read before row address RADDR is incremented.

The timing scheme shown in FIG. 4 is advantageous because it enables a large number of measurements to be output in a small number of clock cycles. This increases the speed of the characterization test, and reduces the test cost per device. In contrast, conventional embodiments require a significant delay between each row measurement of the memory array to allow for the charging and discharging of the word lines with an on-board charge pump. Additionally, embodiments that provide measurement data via a wide external data bus are more efficient, as the measurement data can be clocked out quickly in a parallel fashion, which is faster than using narrower output buses or narrower special purpose buses such as narrow test busses or control busses.

It should be understood that the timing diagram of FIG. 4 is just one example of possible signal timing relationships in embodiment characterization systems. In alternative embodiments, different timing relationships may be implemented. For example, in an alternative embodiment, data lines DATA may be updated every n clock cycles, where n is less than or greater than five.

FIGS. 5A, 5B and 5C illustrate example memory cells that could be used to implement memory cells 105 of non-volatile memory array 104 according to embodiments of the present invention. For example, an embodiment of a one transistor (1T) SONOS memory cell is illustrated in FIG. 5A that includes an N-type SONOS transistor having gate, drain and source terminals (see, FIG. 5C). The gate of the SONOS transistor is coupled for receiving a SONOS word line (WLS) voltage, the drain is coupled for receiving a bit line (BL) voltage and the source is coupled for receiving a source line (SL) voltage. As shown in the cross-section of FIG. 5C, the substrate or well of the SONOS transistor is coupled for receiving a well bias voltage (P-WELL). Exemplary voltages for reading, erasing and programming a 1T SONOS memory cell are shown in FIG. 5D and discussed in more detail below.

An embodiment of a 2T SONOS memory cell is illustrated in FIG. 5B, which includes an N-type SONOS transistor and an N-type pass device (FNPASS) that is included to minimize leakage currents during read operations. The SONOS gate is coupled for receiving the SONOS word line (WLS) voltage, while the drain is coupled for receiving the bit line (BL) voltage. The source of the SONOS transistor is coupled to the drain of the FNPASS device. The gate of the FNPASS device is coupled for receiving the word line (WL) voltage, while the source is coupled for receiving the source line (SL) voltage. The SONOS and FNPASS devices may share a common substrate connection. Like the 1T cell, a well bias voltage (P-WELL) is supplied to the substrate of the SONOS and FNPASS devices to facilitate read, erase and program operations. Exemplary voltages for reading, erasing and programming a 2T SONOS memory cell are shown in FIG. 5D and discussed in more detail below.

FIG. 5C is a cross-section illustrating an embodiment of an N-type SONOS transistor. Although N-type devices are illustrated in FIGS. 5A to 5C, the memory architecture described herein is not so limited and may include p-type devices in other embodiments. A skilled artisan would understand how the memory architecture could be modified to accommodate such devices.

As shown in FIG. 5C, the gate of the SONOS transistor is separated from the channel by a stack of dielectric layers. The dielectric stack (often referred to as an "ONO stack") may include a thin tunneling layer (typically, an oxide) above the channel, a charge-trapping layer (typically, a nitride) above the tunneling layer, and a blocking layer (typically, an oxide) between the charge-trapping layer and the gate. The charge trapping layer of the SONOS transistor is the storage node for the 1T and 2T memory cells shown, e.g., in FIGS. 5A and 5B. The charge trapping layer may be "charged" to alter the threshold voltage (Vt) of the SONOS transistor and change the value of the bit stored within the 1T or 2T memory cell (e.g., to a "0" or "i"). The threshold voltage (Vt) is defined as the threshold gate-source voltage for current to flow through the SONOS transistor.

A SONOS memory cell in accordance with embodiments of the present invention may be programmed or erased by applying a voltage of the proper polarity, magnitude and duration between the gate terminal and the source/drain/substrate terminals of the SONOS transistor. This voltage is referred to as the gate-to-channel voltage. For example, a SONOS memory cell can be programmed by raising the gate-to-channel voltage of the SONOS transistor to a relatively high positive value (typically between 7V and 12V). This causes electrons to tunnel from the channel to the ONO stack, where they become trapped in the charge trapping nitride layer. The trapped charge produces an energy barrier between the transistor drain and source, which raises the threshold voltage (Vt) of the SONOS transistor. In one embodiment, a "1" bit may be stored within the memory cell by raising the threshold voltage of a programmed SONOS transistor to a substantially positive Vt. The electrons trapped within the nitride layer can be removed by applying a negative gate-to-channel voltage (typically between −7V and −12V) to the SONOS transistor, thereby lowering the threshold voltage of the SONOS transistor and erasing the contents of the memory cell. In one embodiment, an erased SONOS transistor with a substantially negative Vt may be used to store a "0" bit within the memory cell. Once programmed or erased, the contents of the SONOS memory cell may be read by applying nominal voltages to a particular combination of word, bit and source lines, and sensing whether or not current is flowing on the corresponding bit line.

An exemplary bias voltage scheme for reading, erasing and programming 1T and 2T SONOS memory cells is shown in FIG. 5D. Some of the bias voltages shown in FIG. 5D include two entries separated by a slash (/). If two entries are included, the first entry corresponds to a "select bias" and the second entry corresponds to a "de-select bias." In some embodiments, the non-volatile memory array 104 may be partitioned into multiple "blocks" and/or multiple "sectors."

If a block or sector architecture is used, the select and de-select biases shown in FIG. 5D may be applied to enabled block(s) or sector(s), in an embodiment. Disabled blocks or sectors may also receive a de-select signal (typically 0V), with the exception of the WL in the 2T cell block architecture (since the WL spans across multiple blocks, a WL may not be disabled if it is connected to an accessed memory cell in an enabled block), in an embodiment. If the memory array is not partitioned into blocks or sectors, the select and de-select biases shown in FIG. 5D may be applied to the entire memory array. Some of the bias voltages shown in FIG. 5D are denoted with an asterisk (*). These bias voltages are exemplary and may differ in other embodiments of the invention. For example, instead of shorting the SL to the BL during program and erase, the SL may be floated.

As shown in FIG. 5D, 1T and 2T SONOS memory cells may be read by applying a bias (VLIM) to the bit line (BL), while grounding the source line (SL) and SONOS word line (WLS) of selected memory cell(s). The word line (WL) of a selected 2T cell may also receive an appropriate voltage bias during read operations. This enables current to flow (or not flow) on the bit line, depending on the threshold voltage (V) of the SONOS device. As described in more detail below, bit line currents may be sensed or "read" by a sense amplifier. In one embodiment, a current value close to zero may indicate the presence of a "1" bit, whereas a substantially higher current value may indicate the presence of a "0" bit in the selected cell. The opposite may be true in alternative embodiments of the invention.

As shown in FIG. 5D, the bias (VLIM) applied to selected BLs during read operations is limited to avoid disturbing other cells on the same BL. In one embodiment, a VLIM of about 1.2V may be provided. As further shown in FIG. 5D, a power supply voltage (VPWR) is supplied to the WL of selected 2T cells to activate the N-channel FNPASS devices during read operations. In one embodiment, a power supply voltage of about 2V may be supplied to the WL of selected 2T cells. In other embodiments, read currents may be increased by supplying a pumped bias above the power supply level to the WL of selected 2T cells. It is noted, however, that the read bias voltages shown in FIG. 5D and are exemplary and should not be considered to limit the invention.

In some embodiments, select/de-select biases (e.g., 1.2V/0V) may be applied to the BLs of the 1T and 2T memory cells, as well as the word line (WL) connected to the pass device (FNPASS) within the 2T cell. A select/de-select bias (e.g., 0V/−2V) may also be applied to the WLS line of the 1T cell to select/de-select the cells during read operations. The select/de-select bias may be used on the WLS line of the 1T cell, because it does not have a pass device. As shown in FIG. 5D, the read bias supplied to the P-well may be different for 1T and 2T cells. In one embodiment, 0V may be applied to the substrate of the 2T cell. However, a slightly negative bias (e.g., −2V) may be applied to the substrate of a 1T cell. The negative bias applied to the P-well results in a 0V gate-to-channel voltage for de-selected memory cells. It is noted, however, that the read bias voltages mentioned herein are exemplary and may differ in other embodiments of the invention.

As shown in FIG. 5D, 1T SONOS memory cells may be erased by applying a negative voltage (VNEG) to the SONOS word line (WLS) and a positive voltage (VPOS) to the bit lines (BL), source lines (SL) and substrate (P-Well) of targeted or "selected" memory cells. The SONOS word line (WLS) of unselected memory cells within the enabled block or sector is biased with VPOS to avoid erasing memory cells on unselected rows.

A similar biasing scheme is shown in FIG. 5D for erasing 2T SONOS memory cells. However, the 2T scheme differs from the 1T scheme by applying a select/de-select bias to the word lines (WL) connected to the pass device (FNPASS) in the 2T cell. In one embodiment, VPWR may be applied to a selected WL, while 0V is applied to all de-selected WLs. The select/de-select biases applied to the WLs during erase may be generated, for example, by word line drivers 103.

As shown in FIG. 5D, 1T SONOS memory cells may be programmed by applying a positive voltage (VPOS) to the SONOS word line (WLS) and a negative voltage (VNEG) to the bit lines (BL), source lines (SL) and substrate (P-Well) of selected memory cells. The SONOS word line (WLS) of unselected memory cells within the enabled block or sector is biased with VNEG to avoid programming memory cells on unselected rows.

In some embodiments, the BL and SL of unselected memory cells may be biased (VBL) to avoid programming memory cells, which are to be left in the erased state. As described in more detail below, a VBL bias between 0V and VPWR may be used to inhibit programming of certain cells. In one embodiment, a VBL of about 1V may be provided.

A similar biasing scheme is shown in FIG. 5D for programming 2T SONOS memory cells. However, the 2T scheme differs from the 1T scheme by applying a VWL bias (typically between 0V and VNEG) to the word line (WL) of all 2T cells to reduce HV damage to the SONOS device during program operations.

As further shown in FIG. 5D, a SONOS memory cell may be programmed and erased by applying positive (VPOS) and negative (VNEG) voltages to the gate, drain, source and substrate terminals of the SONOS transistor. In various embodiments, the SONOS memory cell may be programmed or erased in the manner described above prior to applying embodiment characterization methods.

The selection and biasing of the memory cells during embodiment characterization operations is similar to the selection and biasing of the memory cells during a read operation. For example, VPWR may be applied to the WL of the selected 2T cells to activate the FNPASS devices, while a ground voltage (0 V) is applied to the WLS of the selected 2T cells. For 1T cells, the ground voltage (0 V) is applied to the WLS of the selected 1T cells.

Figure 6:
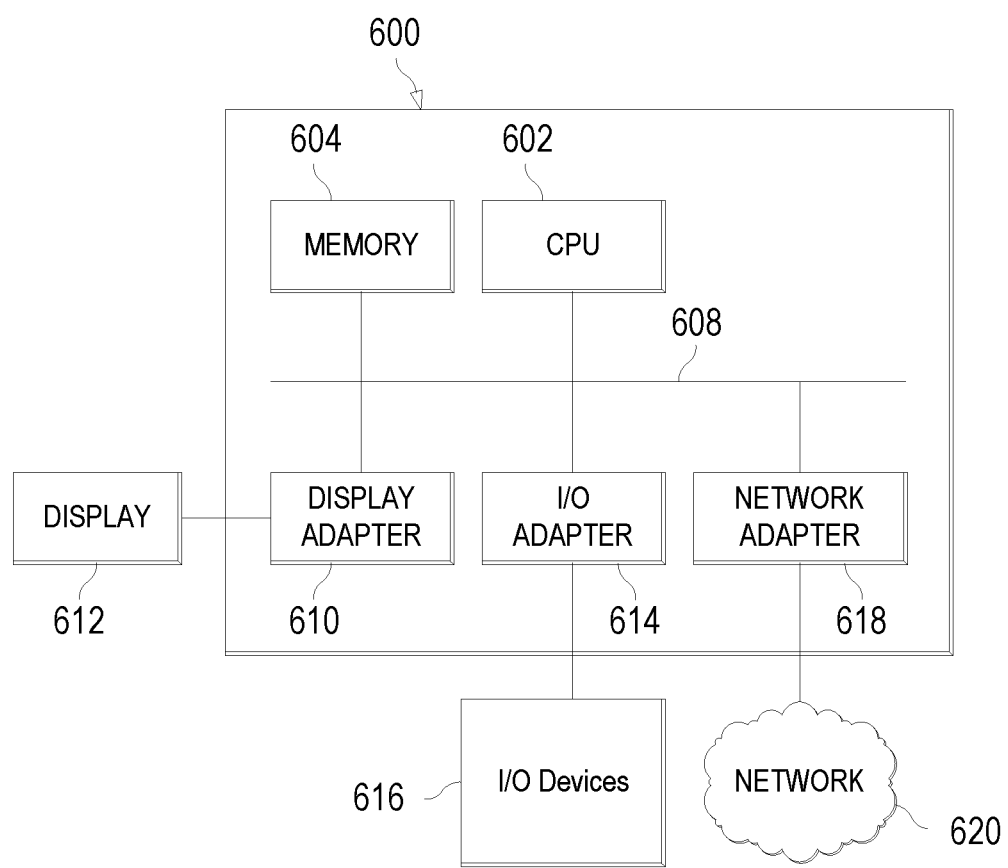
FIG. 6 illustrates a processing system that can be used to implement portions of embodiment systems.

Referring now to FIG. 6, a block diagram of a processing system 600 is provided in accordance with an embodiment of the present invention. The processing system 600 depicts a general-purpose platform and the general components and functionality that may be used to implement portions of embodiments described herein such as controller 106, test controller 116, BIST 118 and/or tester 120 described above with respect to FIG. 1A. For example, processing system 600 may be used to implement some or all of the processing used to analyze memory cell characterization results and determine which reference currents to apply to the memory array under test. Processing system 600 may also be used to implement portions of the embodiment method described herein with respect to FIGS. 2A and 2B.

Processing system 600 may include, for example, a central processing unit (CPU) 602, and memory 604 connected to a bus 608, and may be configured to perform the processes discussed above according to programmed instructions stored in memory 604 or on other non-transitory computer readable media. The processing system 600 may further include, if desired or needed, a display adapter 610 to provide connectivity to a local display 612 and an input-output (I/O) adapter 614 to provide an input/output interface for one or more input/output devices 616, such as a mouse, a keyboard, flash drive or the like.

The processing system 600 may also include a network interface 618, which may be implemented using a network adaptor configured to be coupled to a wired link, such as a network cable, USB interface, or the like, and/or a wireless/cellular link for communications with a network 620. The network interface 618 may also comprise a suitable receiver and transmitter for wireless communications. It should be noted that the processing system 600 may include other components. For example, the processing system 600 may include hardware components power supplies, cables, a motherboard, removable storage media, cases, and the like if implemented externally. These other components, although not shown, are considered part of the processing system 600. In some embodiments, processing system 600 may be implemented on a single monolithic semiconductor integrated circuit and/or on the same monolithic semiconductor integrated circuit as other disclosed system components.

Embodiments of the present invention are summarized here. Other embodiments can also be understood from the entirety of the specification and the claims filed herein.

Example 1. A method for characterizing a non-volatile memory, the method including: applying a first voltage on a word line conductively coupled to a non-volatile memory cell; measuring a current flowing through the non-volatile memory cell in response to applying the first voltage, measuring including: using a sense amplifier, comparing the current flowing through the non-volatile memory cell with a plurality of different first currents generated by an adjustable current source while applying the same first voltage on the word line; and determining the measured current based on the comparing.

Example 2. The method of example 1, further including determining whether the measured current falls within a predetermined range.

Example 3. The method of one of examples 1 or 2, further including replacing the non-volatile memory cell with a redundant cell when the measured current does not fall within the predetermined range.

Example 4. The method of one of examples 1 to 3, further including setting a memory operation parameter based on the measured current, where the memory operation parameter includes a write duration or a write voltage.

Example 5. The method of one of examples 1 to 4, where the first voltage is a ground voltage.

Example 6. The method of one of examples 1 to 5, where measuring the current flowing through the non-volatile memory cell includes iteratively adjusting a current generated by the adjustable current source.

Example 7. The method of example 6, where iteratively adjusting the current generated by the adjustable current source includes performing a binary search.

Example 8. The method of one of examples 6 or 7, where iteratively adjusting the current generated by the adjustable current source includes: increasing the current produced by the adjustable current source when a result of the comparing indicates a first comparison result; and decreasing the current produced by the adjustable current source when the result of the comparing indicates a second comparison result opposite the first comparison result.

Example 9. The method of one of examples 6 to 8, where iteratively adjusting the adjustable current source includes iteratively adjusting an input word provided to a current digital-to-analog converter (CDAC).

Example 10. The method of one of examples 1 to 9, where: the non-volatile memory includes a plurality of non-volatile memory cells; and the sense amplifier includes a plurality of sense amplifier circuits configured to determine memory states of the plurality of non-volatile memory cells.

Example 11. The method of example 10, further including providing outputs of the plurality of sense amplifier circuits to an external data bus.

Example 12. The method of one of examples 10 or 11, where: the plurality of non-volatile memory cells is arranged in a row within a memory array; and the method further includes measuring the current flowing through the non-volatile memory cells in at least a portion of the row of the memory array.

Example 13. The method of example 12, where measuring the current flowing through the non-volatile memory cells in at least a portion of the row of the memory array includes selecting the non-volatile memory cells using a column decoder.

Example 14. A memory system including: an integrated circuit including: a memory array including non-volatile memory cells, a plurality of word line drivers coupled to the memory array, a plurality of sense amplifiers coupled to the memory array and coupled to an external data bus, an adjustable current source coupled to the plurality of sense amplifiers, and a first control circuit configured to: set the adjustable current source to a test current, and apply a first address to the memory array to select a row of the non-volatile memory cells; and a second control circuit configured to: read outputs of the sense amplifier, and iteratively update the test current based on outputs of the sense amplifier to determine a current flowing through at least one non-volatile memory cell of the row of the non-volatile memory cells.

Example 15. The memory system of example 14, where the second control circuit is disposed on the integrated circuit.

Example 16. The memory system of example 15, where the second control circuit is external to the integrated circuit.

Example 17. The memory system of one of examples 15 or 16, where the second control circuit is configured to read the outputs of the sense amplifiers via the external data bus.

Example 18. The memory system of one of examples 14 to 17, where each word line driver of the plurality of word line drivers includes: a first transistor coupled between a word line and a positive supply node; and a second transistor coupled between the word line and a negative supply node, where the word line is couplable only to the positive supply node and to the negative supply node respectively via the first transistor and the second transistor.

Example 19. The memory system of example 18, further including: a first level shifter coupled to the first transistor; and a second level shifter coupled to the second transistor, where the word line driver includes no further level shifting circuitry besides the first level shifter and the second level shifter.

Example 20. The memory system of one of examples 14 to 19, where the adjustable current source includes a current DAC.

Example 21. The memory system of one of examples 14 to 20, where the non-volatile memory cells include silicon-oxide-nitride-oxide-silicon (SONOS) memory cells.

Example 22. A method of characterizing a non-volatile memory, the method including: operating the non-volatile memory in a test mode including: performing a test read of the non-volatile memory including: applying a row address to non-volatile memory to select a row of non-volatile memory cells, grounding word lines coupled to the selected row of non-volatile memory cells, measuring a current of least one non-volatile memory cell of the row of non-volatile memory cells with the word lines grounded, and incrementing the row address; and repeating the performing of the test read using the incremented row address.

Example 23. The method of example 22, where the method further includes: applying a column address to select a subset of the row of selected non-volatile memory cells after applying the row address; after measuring the current and before incrementing the row address, incrementing the column address; and after incrementing the column address and before incrementing the row address, repeating the performing of the test read using the incremented column address when the selected row of the non-volatile memory cells has not yet been completely read.

Example 24. The method of one of examples 22 or 23, further including: determining non-functional non-volatile memory cells of the non-volatile memory based on measuring the current; or determining operational memory parameters based on measuring the current.

Example 25. The method of one of examples 22 to 24, where measuring the current of the at least one non-volatile memory cell includes: applying reference current to a sense amplifier coupled to the at least one non-volatile memory cell to produce a sense amplifier output; modifying the reference current based on the sense amplifier output; and repeating the applying the reference current and modifying the reference current to estimate the current of the least one non-volatile memory cell.

Example 26. The method of example 25, where repeating the applying the reference current and modifying the reference current is performed according to a linear search or a binary search.

Example 27. The method of one of examples 22 to 26, where the least one non-volatile memory cell of the row of non-volatile memory cells includes a non-volatile memory cell having a largest or smallest threshold of the non-volatile memory cells of the row of non-volatile memory cells.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for characterizing a non-volatile memory, the method comprising:
    applying a first voltage on a word line conductively coupled to a non-volatile memory cell; and
    measuring a current flowing through the non-volatile memory cell in response to applying the first voltage, measuring comprising:
        using a sense amplifier, comparing the current flowing through the non-volatile memory cell with a plurality of different first currents generated by an adjustable current source while applying the same first voltage on the word line; and
        determining the measured current based on the comparing, wherein measuring the current flowing through the non-volatile memory cell comprises iteratively adjusting a current generated by the adjustable current source.

2. The method of claim 1, further comprising determining whether the measured current falls within a predetermined range.

3. The method of claim 2, further comprising replacing the non-volatile memory cell with a redundant cell when the measured current does not fall within the predetermined range.

4. The method of claim 1, further comprising setting a memory operation parameter based on the measured current, wherein the memory operation parameter comprises a write duration or a write voltage.

5. The method of claim 1, wherein the first voltage is a ground voltage.

6. The method of claim 1, wherein iteratively adjusting the current generated by the adjustable current source comprises performing a binary search.

7. The method of claim 1, wherein iteratively adjusting the current generated by the adjustable current source comprises:
increasing the current produced by the adjustable current source when a result of the comparing indicates a first comparison result; and
decreasing the current produced by the adjustable current source when the result of the comparing indicates a second comparison result opposite the first comparison result.

8. The method of claim 1, wherein iteratively adjusting the adjustable current source comprises iteratively adjusting an input word provided to a current digital-to-analog converter (CDAC).

9. The method of claim 1, wherein:
the non-volatile memory comprises a plurality of non-volatile memory cells; and
the sense amplifier comprises a plurality of sense amplifier circuits configured to determine memory states of the plurality of non-volatile memory cells.

10. The method of claim 9, further comprising providing outputs of the plurality of sense amplifier circuits to an external data bus.

11. The method of claim 9, wherein:
the plurality of non-volatile memory cells is arranged in a row within a memory array; and
the method further comprises measuring the current flowing through the non-volatile memory cells in at least a portion of the row of the memory array.

12. The method of claim 11, wherein measuring the current flowing through the non-volatile memory cells in at least a portion of the row of the memory array comprises selecting the non-volatile memory cells using a column decoder.

13. A memory system comprising:
an integrated circuit comprising:
a memory array comprising non-volatile memory cells,
a plurality of word line drivers coupled to the memory array,
a plurality of sense amplifiers coupled to the memory array and coupled to an external data bus,
an adjustable current source coupled to the plurality of sense amplifiers, and
a first control circuit configured to:
set the adjustable current source to a test current, and
apply a first address to the memory array to select a row of the non-volatile memory cells; and
a second control circuit configured to:
read outputs of the sense amplifier, and
iteratively update the test current based on outputs of the sense amplifier to determine a current flowing through at least one non-volatile memory cell of the row of the non-volatile memory cells.

14. The memory system of claim 13, wherein the second control circuit is disposed on the integrated circuit.

15. The memory system of claim 14, wherein the second control circuit is external to the integrated circuit.

16. The memory system of claim 15, wherein the second control circuit is configured to read the outputs of the sense amplifiers via the external data bus.

17. The memory system of claim 13, wherein each word line driver of the plurality of word line drivers comprises:
a first transistor coupled between a word line and a positive supply node; and
a second transistor coupled between the word line and a negative supply node, wherein the word line is couplable only to the positive supply node and to the negative supply node respectively via the first transistor and the second transistor.

18. The memory system of claim 17, further comprising:
a first level shifter coupled to the first transistor; and
a second level shifter coupled to the second transistor, wherein the word line driver comprises no further level shifting circuitry besides the first level shifter and the second level shifter.

19. The memory system of claim 13, wherein the adjustable current source comprises a current DAC.

20. The memory system of claim 13, wherein the non-volatile memory cells comprise silicon-oxide-nitride-oxide-silicon (SONOS) memory cells.

21. A method of characterizing a non-volatile memory, the method comprising:
operating the non-volatile memory in a test mode comprising:
performing a test read of the non-volatile memory comprising:
applying a row address to non-volatile memory to select a row of non-volatile memory cells,
grounding word lines coupled to the selected row of non-volatile memory cells,
measuring a current of least one non-volatile memory cell of the row of non-volatile memory cells with the word lines grounded, and
incrementing the row address; and
repeating the performing of the test read using the incremented row address.

22. The method of claim 21, wherein the method further comprises:
applying a column address to select a subset of the row of selected non-volatile memory cells after applying the row address;
after measuring the current and before incrementing the row address, incrementing the column address; and
after incrementing the column address and before incrementing the row address, repeating the performing of the test read using the incremented column address when the selected row of the non-volatile memory cells has not yet been completely read.

23. The method of claim 21, further comprising:
determining non-functional non-volatile memory cells of the non-volatile memory based on measuring the current; or
determining operational memory parameters based on measuring the current.

24. The method of claim 21, wherein measuring the current of the at least one non-volatile memory cell comprises:
applying reference current to a sense amplifier coupled to the at least one non-volatile memory cell to produce a sense amplifier output;
modifying the reference current based on the sense amplifier output; and repeating the applying the reference current and modifying the reference current to estimate the current of the least one non-volatile memory cell.

25. The method of claim 24, wherein repeating the applying the reference current and modifying the reference current is performed according to a linear search or a binary search.

26. The method of claim 21, wherein the least one non-volatile memory cell of the row of non-volatile memory cells comprises a non-volatile memory cell having a largest or smallest threshold of the non-volatile memory cells of the row of non-volatile memory cells.

27. The memory system of claim 13, wherein the second control circuit is further configured to setting a memory operation parameter based on the measured current, wherein the memory operation parameter comprises a write duration or a write voltage.

* * * * *